United States Patent
Wang et al.

(10) Patent No.: US 9,318,445 B2
(45) Date of Patent: Apr. 19, 2016

(54) SEMICONDUCTOR DEVICE AND MANUFACTURING METHOD THEREOF FOR PROTECTING METAL-GATE FROM OXIDATION

(71) Applicant: SEMICONDUCTOR MANUFACTURING INTERNATIONAL (BEIJING) CORPORATION, Beijing (CN)

(72) Inventors: Xinpeng Wang, Beijing (CN); Yi Huang, Beijing (CN); Shih-Mou Chang, Beijing (CN)

(73) Assignee: SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 13/911,805

(22) Filed: Jun. 6, 2013

(65) Prior Publication Data
US 2013/0264616 A1    Oct. 10, 2013

Related U.S. Application Data

(62) Division of application No. 13/316,165, filed on Dec. 9, 2011.

(30) Foreign Application Priority Data

Aug. 26, 2011   (CN) .......................... 2011 10 246794

(51) Int. Cl.
| H01L 29/76 | (2006.01) |
| H01L 29/66 | (2006.01) |
| H01L 23/00 | (2006.01) |
| H01L 29/78 | (2006.01) |
| H01L 21/768 | (2006.01) |

(52) U.S. Cl.
CPC ........ *H01L 23/564* (2013.01); *H01L 21/76801* (2013.01); *H01L 21/76816* (2013.01); *H01L 29/78* (2013.01); *H01L 29/66575* (2013.01); *H01L 2924/0002* (2013.01)

(58) Field of Classification Search
USPC .......................... 257/288, E21.444, E29.255
See application file for complete search history.

(56) References Cited

U.S. PATENT DOCUMENTS

| 2003/0119243 | A1* | 6/2003 | Shin et al. ...................... 438/200 |
| 2006/0270215 | A1* | 11/2006 | Lee et al. .......... H01L 21/28525 438/637 |
| 2007/0128787 | A1* | 6/2007 | Higashitani ................... 438/201 |
| 2008/0157365 | A1* | 7/2008 | Ott et al. ....................... 257/750 |
| 2011/0254093 | A1* | 10/2011 | Wang et al. ................... 257/368 |
| 2011/0256683 | A1* | 10/2011 | Zhu et al. ...................... 438/290 |

OTHER PUBLICATIONS

Jie Diao, et al., "ILDO CMP: Technology Enabler for High K Metal Gate in High Performance Logic Devices", Silicon Systems Group, CMP Div., Applied Materials Inc., 2010 IEEE, 978-1-4244-6519-7/10, pp. 247-250.

* cited by examiner

*Primary Examiner* — Marc Armand
*Assistant Examiner* — Wilner Jean Baptiste
(74) *Attorney, Agent, or Firm* — Koppel, Patrick, Heybl & Philpott

(57) ABSTRACT

A semiconductor device and a manufacturing method thereof is provided. The method comprises: providing a substrate for the semiconductor device with a gate structure and a first dielectric interlayer being formed thereon, said gate structure comprising a metal gate and an upper surface of said first dielectric interlayer being substantially flush with an upper surface of said gate; forming an interface layer to cover at least the upper surface of said gate such that the upper surface of said gate is protected from being oxidized; and forming a second dielectric interlayer on said interface layer.

5 Claims, 4 Drawing Sheets

SEMICONDUCTOR DEVICE AND MANUFACTURING METHOD THEREOF FOR PROTECTING METAL-GATE FROM OXIDATION

CROSS-REFERENCE TO RELATED APPLICATIONS

This application is a divisional application from, and claims the benefit of, U.S. patent application Ser. No. 13/316,165 to Wang et al., also entitled "Semiconductor Device and Manufacturing Method Thereof," which claims priority to Chinese Patent Application No. 201110246794.6, filed on Aug. 26, 2011 and entitled "Semiconductor Device and Manufacturing Method Thereof," which is incorporated in its entirety herein by reference.

FIELD OF THE INVENTION

The present invention relates to the field of semiconductor fabrication techniques, and more specifically, relates to semiconductor devices and manufacturing methods therefor.

DESCRIPTION OF THE RELATED ART

As known by those of ordinary skill in the art, there is a gate-last approach and a gate-first approach for manufacturing a semiconductor device such as a field-effect transistor.

In the gate-last approach, referring to FIG. 8, a dielectric layer 807 and a dummy gate are formed on a substrate 809, preferably, a lightly doped region (LDD) implantation of the substrate 809 is carried out, and then one or more spacers 803 are formed; after the formation of such a dummy gate as described above, source and drain implantation is carried out; and then a first dielectric interlayer 805 is formed and is chemical mechanical polished (CMP) so as to substantially expose an upper surface of the dummy gate; the dummy gate is then removed; and then, a gate dielectric layer and a metal gate are formed, for example, by depositing gate dielectric (in some embodiments, it may be a high-k dielectric) and metal gate material, followed by the CMP process so as to form a gate 801; thereafter, the gate is re-coated with an dielectric interlayer; and then one or more contact holes are subsequently formed.

The gate-first approach is similar to the conventional method of forming poly-silicon gate devices. A dielectric layer 807 and a gate 801 are formed on the substrate 809, preferably, a LDD implantation is carried out therein and then one or more spacers 803 are formed; after the formation of such a gate structure as described above, source and drain implantation is carried out; a first dielectric interlayer 805 is then formed to cover the gate; and then one or more contact holes are formed, also as shown in FIG. 8.

Generally, covering the gate with the first dielectric interlayer is mainly to facilitate the formation of contact holes 821 and 823 to a gate and/or to an active area (contact holes are used for forming contacts or wiring)

However, with the shrinkage of contact critical dimensions, the manufacturing process encounters challenges and open contact risk is increased as well. For example, due to the shrinkage of contact critical dimensions, a relatively thick resist may cause a contact hole (or, opening) etching to stop. Moreover, it is difficult to shrink the contact CD to a desired target value.

Further, during a manufacturing process of a semiconductor device such as a MOS transistor, metal gates (e.g. Al or Al—Ti alloy) can be easily oxidized in a deposition process of an dielectric interlayer (e.g. an interlayer oxide layer), and thus a metal oxide layer is generated on the surface of the gate.

The metal oxide layer thus formed may be dense and is difficult to etch, particularly for aluminium oxide. Moreover, such a metal oxide layer would increase the contact resistance.

Thus, there exists the need for a solution to address the above problems relating to metal gate oxidation.

SUMMARY OF THE INVENTION

An object of the present invention is to at least partly address the aforementioned problems in the prior art.

Another object of the present invention is to provide a semiconductor device and a manufacturing method therefor, in which a metal gate can be protected from being oxidized during an interlayer dielectric (e.g. oxide) deposition process.

A further object of the present invention is to provide a semiconductor device and a manufacturing method therefor, in which a metal gate can be protected from being oxidized by resist ashing (or oxygen-containing dry etch) during a contact hole etch process.

According to one aspect of the present invention, there is provided a method of manufacturing a semiconductor device, comprising: providing a substrate for the semiconductor device with a gate structure and a first dielectric interlayer formed on the substrate, wherein said gate structure comprises a metal gate and an upper surface of said first dielectric interlayer is substantially flush with an upper surface of said gate; forming an interface layer on said substrate to cover at least the upper surface of said gate such that the upper surface of said gate is protected from being oxidized; and forming a second dielectric interlayer on said interface layer.

Said method may further comprise: patterning said second dielectric interlayer to form an opening that penetrates through said second dielectric interlayer, thereby exposing a part of a surface of said interface layer.

Said method may further comprise: forming a patterned resist on said second dielectric interlayer; etching said second dielectric interlayer by using said patterned resist as a mask, so as to form said opening, wherein the etching of said second dielectric interlayer is deliberately stopped at said interface layer.

Said method may further comprise: after etching of said second dielectric interlayer, removing said resist by ashing. During the ashing process, said interface layer protects the metal gate from being affected by the ashing.

Said method may further comprise: etching the exposed part of said interface layer by using the patterned second dielectric interlayer as a mask, so as to form an opening that penetrates through said interface layer, thereby exposing at least a part of the upper surface of said gate and/or a part of surface of said first dielectric interlayer.

Said method may further comprise: etching the exposed part of the first dielectric interlayer, so as to form an opening that penetrates through said first dielectric interlayer, thereby exposing a part of the surface of the substrate.

Said method may further comprise: the exposed surface of said substrate being located on a source region or a drain region of the semiconductor device.

Said metal gate may include aluminium.

The material of said interface layer can be silicon nitride, silicon carbide, or doped silicon carbide.

Said interface layer can have a thickness of 5~250 nm.

The step of providing a semiconductor device substrate may comprise: forming a gate structure of a dummy gate on the substrate, wherein said comprises a dummy gate, a dielectric layer underlying the dummy gate, and a spacer for said dummy gate; performing implantation to form a source region and a drain region in the substrate; forming the first dielectric interlayer on the substrate and chemical mechanical polishing the first dielectric interlayer, thereby exposing a top surface of the dummy gate; removing said dummy gate; and forming a gate dielectric layer and said metal gate such that the upper surface of said metal gate, is substantially flush with the upper surface of said first dielectric interlayer.

The step of providing a semiconductor device substrate may comprise: forming said gate structure on the substrate, wherein said gate structure further comprises a dielectric layer underlying said metal gate and a spacer for said metal gate; performing implantation to forma source region and a drain region in the substrate; forming a first dielectric interlayer on the substrate such that the upper surface of said metal gate is substantially flush with the upper surface of said first dielectric interlayer.

According to another aspect of the present invention, there is provided a semiconductor device, which comprises: a substrate; a gate structure and a first dielectric interlayer on said substrate, wherein said gate structure comprises a metal gate, and an upper surface of said first dielectric interlayer when is substantially flush with an upper surface of said gate; an interface layer that covers at least the upper surface of said gate such that the upper surface of the gate is protected from being oxidized; and a second dielectric interlayer on said interface layer.

Said second dielectric interlayer has a first opening that penetrates through said second dielectric interlayer thereby exposing a part of surface of said interface layer.

Said interface layer may have a second opening that penetrates through said interface layer, said second opening is underlying said first opening such that at least a part of upper surface of said metal gate and/or a part of surface of said first dielectric interlayer are/is exposed.

Said first dielectric interlayer may have a third opening that penetrates through said first dielectric interlayer, said third opening underlying the second opening such that a part of surface of said substrate is exposed.

Said metal gate may include aluminium.

The material of said interface layer may be silicon nitride, silicon carbide, or doped silicon carbide.

Said interface layer may have a thickness of 5-250 nm.

According to one embodiment of the present invention, the metal gate can be protected from being oxidized in a deposition process of an interlayer dielectric (e.g. oxide). Moreover, the metal gate can be protected from being oxidized by resist ashing (or oxygen-containing dry etch) in the contact hole etch process. In addition, according to one embodiment of the present invention, the material of the interface layer can be selected such that it is easy to etch. According to one embodiment of the present invention, the contact resistance of a contact also can be reduced.

Further, according to one embodiment of the present invention, one or more technical effects as below can be at least partly achieved. The contact CD can be easily shrunk to a desired target value. The contact resistance (Rc) can be controlled to be consistent with the designed or calculated result. A good process window for dielectric interlayer deposition can be obtained. The void issue can be lightened or settled. The aspect ratio can be reduced such that the process is easy for contact metal deposition. The spacer basically will not be etched or damaged so that leakage from the top of the gate can be reduced.

The present invention is very useful in advanced semiconductor manufacturing technology (such as logic devices or manufacturing process optimized for logic devices), but, it is not so limited. Practically, the present invention can be applied to a broader category of technology.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings, which are incorporated herein together with the description serve to explain the principles of the invention. The present invention can be better understood through reading the following detailed description of embodiments with reference to the attached drawings, in which.

Figure 1:
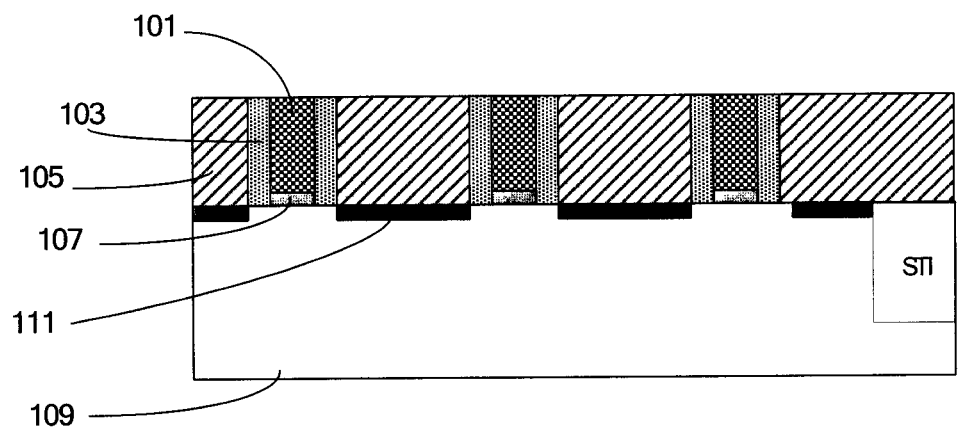
FIGS. 1-7 are diagrams showing various stages in a method of manufacturing a semiconductor device according to an embodiment of the present invention.

It is understood that these drawings are merely illustrative in nature and are not intended to limit the scope of the present invention. In the drawings, various components are not illustrated strictly to or according to their actual shapes, wherein, some of the components (such as, layers or parts) may be enlarged relative to others to more clearly illustrate the principles of the present invention. Moreover, details that may obscure the gist of the present invention are not shown in the drawings.

DESCRIPTION OF THE EMBODIMENTS

The embodiments of the present invention will be described below in conjunction with the drawings.

FIGS. 1-7 show steps in a method of manufacturing a semiconductor device according to an embodiment of the present invention.

As shown in FIG. 1, a substrate 109 which includes shallow trench isolation (STI), for a semiconductor device is provided with a gate structure and a first dielectric interlayer 105 formed on the substrate 109. The gate structure comprises a metal gate 101. An upper surface of the first dielectric interlayer 105 is substantially flush with an upper surface of the gate 101.

The substrate is typically a mono-crystalline silicon substrate. However, the present invention should not be limited thereto. According to different applications, the substrate can be a semiconductor-on-semiconductor (SOI) substrate, a poly-silicon substrate, a compound semiconductor substrate, an insulating substrate (e.g. a glass substrate) having a semiconductor material layer formed thereon, or any other suitable substrate, so long as it can be used for forming a semiconductor device.

A silicide layer 111 can be formed on a desired part of an active area of the substrate (e.g. a part on which contact to the active area is to be formed), so as to reduce contact resistance.

The metal gate 101 typically can comprise aluminium (Al), or aluminium-titanium (Al—Ti) alloy. However, it is understood that the material for forming the metal gate 101 is not so limited.

The gate structure can further comprise a dielectric layer 107 underlying the metal gate 101. As for the material of the dielectric layer 107, it is not particularly limited, and it can be, for example, silicon oxide, silicon nitride, silicon oxynitride, silicon nitride oxide, or a stacked of the above materials.

The gate structure can further comprise spacers 103 for the gate 101. Herein, the spacer 103 can be formed of, for example, silicon nitride, silicon oxide or silicon nitride and silicon oxide.

Typically, the material of the first dielectric interlayer 105 can be silicon oxide, for example, a deposited silicon oxide. However, those skilled in the art will appreciate that, the material of the first dielectric interlayer 105 should not be limited thereto. For example, in some embodiments, it can be TEOS, BPSG, or the like.

In some examples of the present invention, the substrate comprising a gate structure and a first dielectric interlayer 105 as described above is subjected to a chemical mechanical polishing process such that the upper surface of the gate is substantially flush with the upper surface of the first dielectric interlayer 105.

For example, in the gate-first approach (for example, metal gate or poly-silicon gate), after the formation of the first dielectric interlayer 105, CMP is performed such that the upper surface of the gate is exposed. As such, the upper surface of the gate is substantially flush with the upper surface of the first dielectric interlayer. The CMP that exposes the upper surface of the gate can be triggered to stop, or can be stopped by timing.

In one particular embodiment of the present invention, the step of providing a substrate for the semiconductor device can comprise: forming a gate structure of dummy gate on the substrate 109, wherein said gate structure comprises a dummy gate, a dielectric layer underlying the dummy gate, and spacer(s) for said dummy gate; performing implantation to form a source region and a drain region in the substrate; forming a first dielectric interlayer 105 on the substrate and performing a chemical mechanical polishing (CMP) to expose the upper surface of the dummy gate; removing said dummy gate; and forming a gate dielectric layer and said metal gate 101, such that the upper surface of said metal gate is substantially flush with the upper surface of said first dielectric interlayer 105 (for example, by means of CMP).

In the gate-last approach, the re-coating of the dielectric interlayer 105 can not be performed after the CMP process for formation of metal gate, such that the upper surface of the gate is substantially flush with the upper surface of the first dielectric interlayer 105.

In another particular example of the present invention, the step of providing a substrate for the semiconductor device can comprise: forming the gate structure on the substrate 101, wherein the gate structure further comprises a dielectric layer 107 underlying the metal gate and spacer(s) 103 for the metal gate; performing implantation to form a source region and a drain region in the substrate; forming a first dielectric interlayer 105 on the substrate such that the upper surface of the metal gate is substantially flush with the upper surface of the first dielectric interlayer 105 (for example, by means of CMP).

In such way, the upper surface of the gate can be made to be substantially flush with the upper surface of the first dielectric interlayer 105.

It is understood that the steps described herein merely illustrate some main steps by way of examples and those of ordinary skill in the art can add, reduce or combine the above steps or otherwise divide a step into several steps. For example, one method according to the present invention may comprise steps such as LDD implantation or Halo and may extend region implantation. Since these techniques are known in the art and are not necessary for the present invention, detailed descriptions thereof are omitted.

In addition, it is understood by those of ordinary skill in the art that it is difficult to avoid certain process variances or offsets which may even be inevitable. Thus, the expression "flush with" as used herein includes "substantially flush with," these two expressions can be interchangeably used throughout the specification and they both include flush with each other within process tolerances." In a certain sense, as used herein, the expression "flush with" or "substantially flush with" means that it is not necessary that they are flush with each other.

Figure 2:
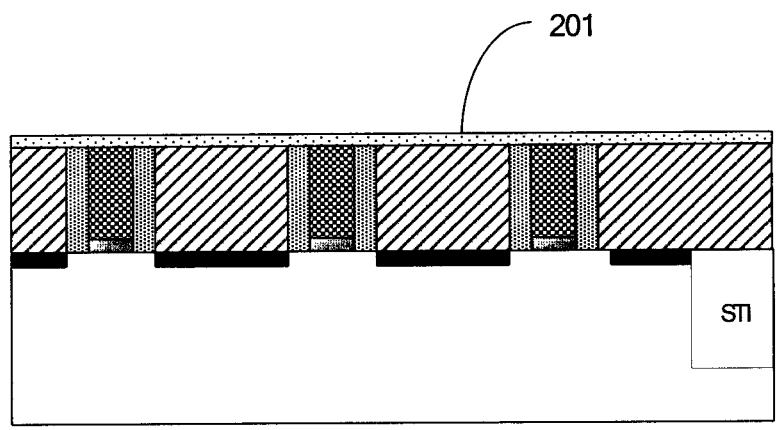

As shown in FIG. 2, an interface layer 201 can be formed on the substrate, which at least covers the upper surface of the gate. The interface layer protects the upper surface of the gate from being oxidized in the subsequent processes, for example, the ashing process of resist (or, oxygen-containing etching), or the process of forming a second dielectric interlayer 105 (which is described below).

The material of the interface layer 201 can be: silicon nitride, silicon carbide, or a doped silicon carbide (for example, doped with N-type dopant). However, it should be understood that, the material of the interface layer is not limited thereto, so long as it can protect the upper surface of the gate from being oxidized during the subsequent processes.

In some embodiments, the interface layer 201 has a thickness of about 5~250 nm.

Figure 3:
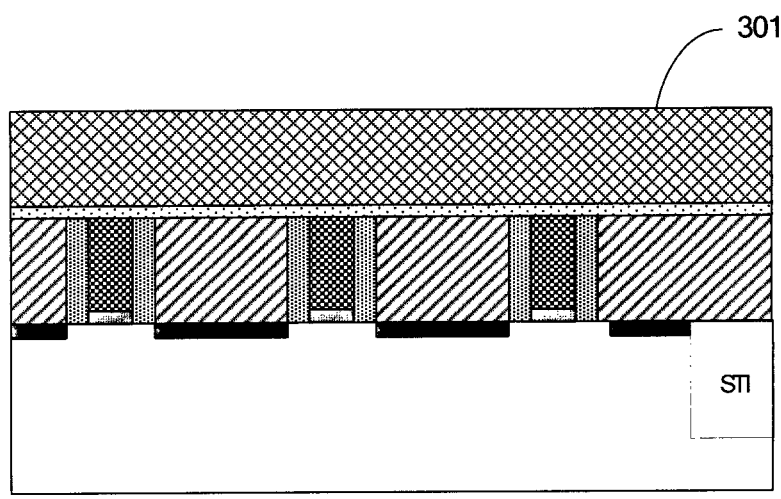

As shown in FIG. 3, a second dielectric interlayer 301 can be formed on the interface layer 201. There is no particular limitations as to the material of the second dielectric interlayer and it can be the same as or different from the material of the first dielectric interlayer 105. Since the interface layer 201 has been formed, the metal gate 101 is not oxidized during the formation process of the second dielectric interlayer 301.

The second dielectric interlayer 301 can be patterned so as to form an opening (first opening) that penetrates through the second dielectric interlayer 301 thereby exposing a part of the surface of the interface layer.

Figure 4:
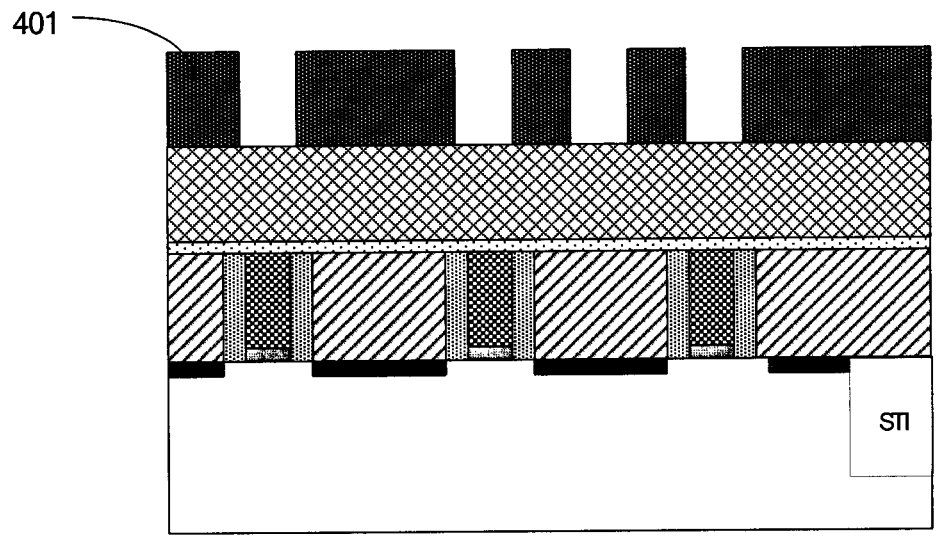

In further implementation of the present invention, as shown in FIG. 4, a patterned resist 401 can be formed on the second dielectric interlayer 301. For example, the resist 401 can be formed on the second dielectric interlayer 301 by spin coating and then patterned. In another example, the resist 401 can be patterned by means of a patterned mask whereby the patterned resist 401 is formed. However, it is understood that the method of forming a patterned resist on the second dielectric interlayer 301 is not so limited. In some examples of the present invention, the patterned resist 401 can be formed on the second dielectric interlayer 301 by a droplet discharge method, a printing method (e.g. a screen printing method) or the like.

Figure 5:
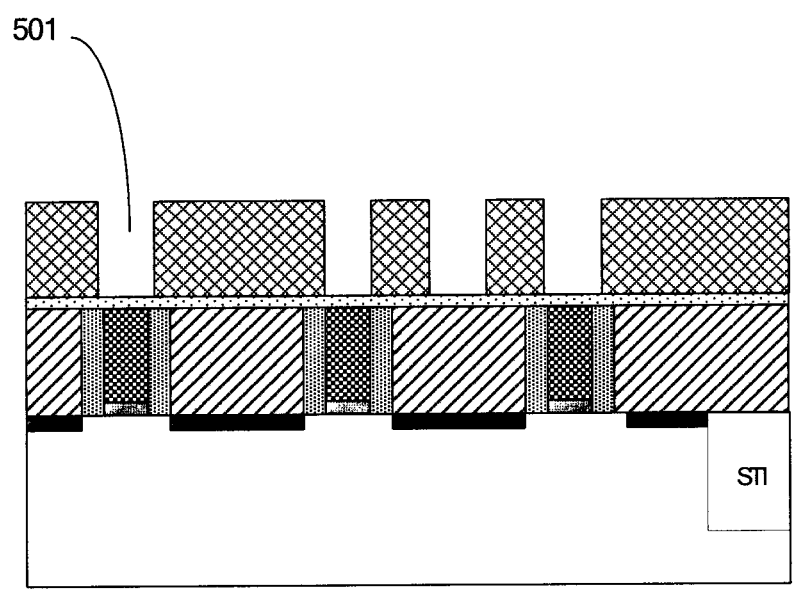

As shown in FIG. 5, the second dielectric interlayer 301 can be etched by use of the patterned resist 401 as a mask, so as to form an opening (first opening, for example, 501 or the like) in the second dielectric interlayer 301 that exposes the underlying interface layer 201. Note that, preferably, the material of the interface layer 201 is selected such that the etching to form the opening (e.g. 501 or the like) can be advantageously stopped, for example, at the interface layer 201. The material of the interface layer 201 can be: silicon nitride, silicon carbide, or a doped silicon carbide.

Those of ordinary skill in the art will appreciate that, although the material of the interface layer 201 can be selected such that the material of the second dielectric interlayer 301 has a relatively high etch selectivity with respect thereto, the material of the interface layer still may be etched slightly so that a part thereof is removed. Such a situation also falls within the scope of the present invention.

The resist 401 can be removed. Typically, the resist 401 can be removed by ashing (or, oxygen-containing dry etching). At this point, since the etching for forming the opening 501 in the second dielectric interlayer 301 is stopped at the interface layer 201, the interface layer 201 can protect the metal gate 101 from being affected (for example, from being oxidized) by the ashing (or oxygen-containing dry etching).

Figure 6:
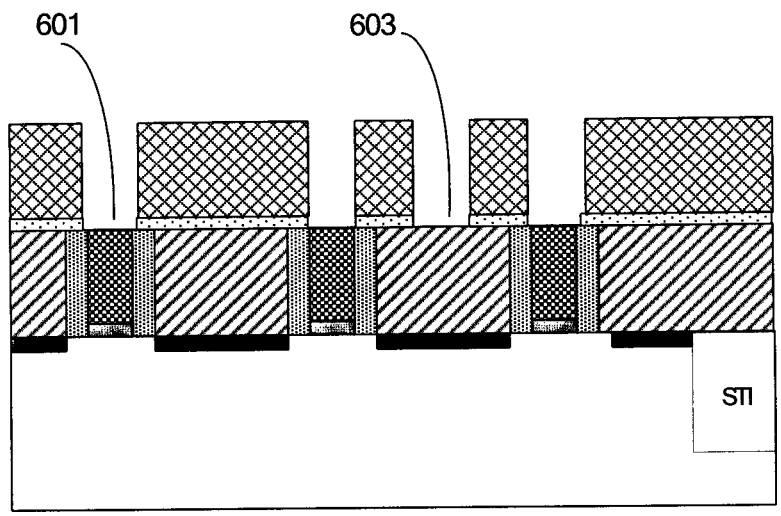

The exposed part of the interface layer can be etched by use of the patterned second dielectric interlayer 301 (i.e. having an opening 501 formed therein) as a mask, to form an opening (second opening 601, 603) that penetrates through the interface layer, thereby exposing at least a part of the upper surface of the gate and/or a part of the surface of the first dielectric interlayer 105, as shown in FIG. 6.

Although the material of the interface layer 201 may have a relatively high etch selectivity with respect to the first dielectric interlayer 105, etching gases mainly targeted to the first dielectric interlayer 105 can be used since the interface layer 201 is relatively thin. However, it should be appreciated that the selection of etching gases is not limited thereto.

Figure 7:
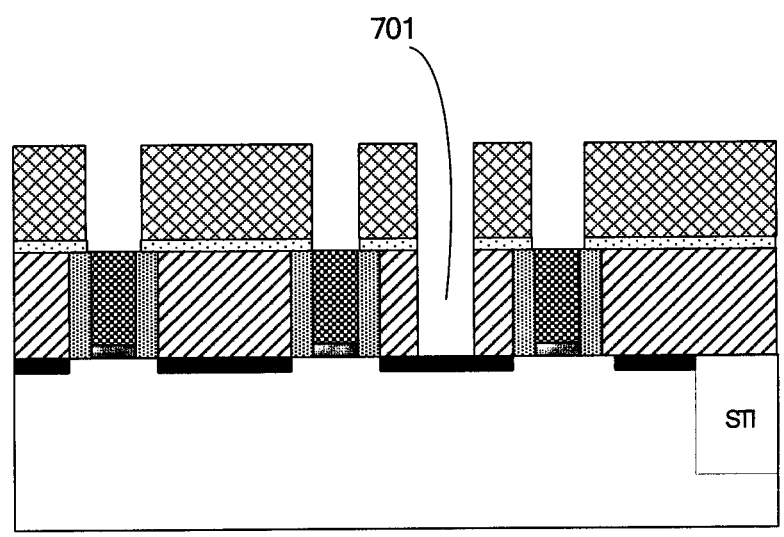
Figure 8:
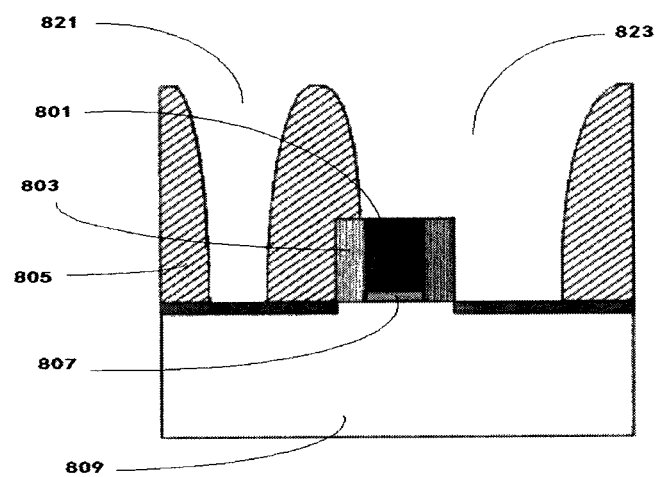
FIG. 8 is a semiconductor device made by a prior art manufacturing process.

As shown in FIG. 7, the exposed part of the first dielectric interlayer 105 can be etched to form an opening (third opening, 701) that penetrates through the first dielectric interlayer, thereby exposing a part of the surface of the substrate. In addition, although it is not shown in FIG. 7, those skilled in the art will understand that, a part of the silicide layer on the active area may be etched off when etching for to form the opening 701.

A conductive material can be deposited in the formed openings, so as to form contacts to the gate and/or to the active area. For example, the conductive material can be deposited (for example, by sputtering) according to the embodiment shown in FIG. 7, thereby forming desirable contacts to the gate and to the active area, which in turn can provide electric connections to the gate and/or to the active area.

The method of manufacturing a semiconductor device according to the embodiments of the present invention has been described above with reference to the figures.

According to another aspect of the present invention, there is provided a semiconductor device, as shown in FIG. 3, which comprises: a substrate 109; a gate structure and a first dielectric interlayer 105 on said substrate 109, wherein, said gate structure comprises a metal gate 101, and an upper surface of said first dielectric interlayer 105 is substantially flush with an upper surface of said gate 101; an interface layer 201 that at least covers the upper surface of said gate 101 such that the upper surface of the gate is protected from being oxidized; and a second dielectric interlayer 301 on said interface layer.

In one example, said second dielectric interlayer 301 can have an opening (first opening, e.g. 501) that penetrates through said second dielectric interlayer 301, thereby exposing a part of the surface of said interface layer.

In another example, said interface layer 201 can have a second opening (e.g. 601 and 603) that penetrates through said interface layer. Said second opening underlys the first opening such that at least a part of the upper surface of said metal gate and/or a part of the surface of said first dielectric interlayer 105 is exposed.

In another example, said first dielectric interlayer 105 can have a third opening that penetrates through said first dielectric interlayer 105, said third opening underlying the second opening such that a part of the surface of said substrate is exposed.

In some examples of the present invention, said metal gate may include aluminium.

In some examples of the present invention, the material of said interface layer can be: silicon nitride, silicon carbide, or doped silicon carbide.

Said interface layer may have a thickness of 5-250 nm.

It is understood by those of ordinary skill in the art that the present invention can be easily combined with the gate-first process and the gate-last process.

The embodiments of the present invention have been described above with reference to the drawings. It is understood, however, that these embodiments are merely illustrative in nature and not intended to limit the scope of the claims of this application. These embodiments can be arbitrarily combined without going beyond the scope of the present invention. In addition, the embodiments and details of the present invention can be modified by those of ordinary skill in the relevant art based on the teachings of the invention, without departing from the scope of the present invention. Therefore, all these modifications are within the spirit and scope of the present invention as defined by the attached claims.

What is claimed is:

1. A semiconductor device, comprising:
a substrate;
a gate structure and a first dielectric interlayer on said substrate, wherein
said gate structure comprises a metal gate,
the substrate includes an active area which is adjacent to the gate structure, and the first dielectric interlayer covers the active area, and
an upper surface of said first dielectric interlayer is substantially flush with an upper surface of said metal gate;
an interface layer that overlies the upper surface of said metal gate and the upper surface of the first dielectric interlayer such that the upper surface of the gate is protected from being oxidized; and
a second dielectric interlayer on said interface layer;
wherein said second dielectric interlayer has first openings that penetrate through said second dielectric interlayer,
wherein said interface layer has second openings that penetrate through said interface layer, said second openings are respectively underlying said first openings such that at least a part of the upper surface of said metal gate and a part of a surface of said active area are exposed.

2. The semiconductor device of claim 1, wherein said first dielectric interlayer has a third opening that penetrates through said first dielectric interlayer, said third opening underlying the second opening such that at least a part of the surface of said substrate is exposed.

3. The semiconductor device. of claim 1, wherein said metal gate includes aluminium.

4. The semiconductor device of claim 1, wherein said interface layer has a thickness of 5-250 nm.

5. The semiconductor device of claim 1, wherein the material of said interface layer is silicon nitride, silicon carbide, or doped silicon carbide.

* * * * *